(12) United States Patent
Sung et al.

(10) Patent No.: US 9,153,557 B2
(45) Date of Patent: Oct. 6, 2015

(54) CHIP STACK EMBEDDED PACKAGES

(71) Applicant: SK HYNIX INC., Icheon (KR)

(72) Inventors: Ki Jun Sung, Cheongju (KR); Seung Jee Kim, Seongnam (KR); Jong Hyun Nam, Seoul (KR); Sang Yong Lee, Yongin (KR); Young Geun Yoo, Bucheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/452,323

(22) Filed: Aug. 5, 2014

(65) Prior Publication Data

US 2015/0255427 A1    Sep. 10, 2015

(30) Foreign Application Priority Data

Mar. 4, 2014  (KR) .......................... 10-2014-0025355

(51) Int. Cl.
*H01L 23/00*  (2006.01)
*H01L 25/065*  (2006.01)

(52) U.S. Cl.
CPC ........ *H01L 25/0652* (2013.01); *H01L 25/0657* (2013.01); *H01L 2225/06517* (2013.01); *H01L 2225/06548* (2013.01); *H01L 2225/06555* (2013.01); *H01L 2225/06589* (2013.01); *H01L 2225/06593* (2013.01)

(58) Field of Classification Search
CPC ..................... H01L 25/0652; H01L 25/0657
See application file for complete search history.

(56) References Cited

FOREIGN PATENT DOCUMENTS

| KR | 10-2008-0035984 A | 4/2008 |
|----|-------------------|--------|
| KR | 10-2009-0013386 A | 2/2009 |
| KR | 10-2013-0015461 A | 2/2013 |

*Primary Examiner* — Long Pham (57) ABSTRACT

A chip stack embedded package includes a first dielectric layer having a multistep cavity therein, a first plurality of semiconductor chips disposed in a first level of the multistep cavity, a second plurality of semiconductor chips disposed in a second level of the multistep cavity, and a second dielectric layer filling the multistep cavity to cover the first and second pluralities of semiconductor chips.

19 Claims, 7 Drawing Sheets

CHIP STACK EMBEDDED PACKAGES

CROSS-REFERENCE TO RELATED APPLICATION

The present application claims priority under 35 U.S.C 119(a) to Korean Application No. 10-2014-0025355, filed on Mar. 4, 2014, in the Korean intellectual property Office, which is incorporated herein by reference in its entirety.

BACKGROUND

1. Technical Field

Embodiments of the present disclosure relate to package technologies, and more particularly, to chip stack embedded packages.

2. Related Art

Lighter and smaller electronic products are increasingly desirable in the mobile systems such as smart phones. Accordingly, semiconductor packages employed in electronic products have been continuously scaled down to reduce a thickness and a size thereof.

Various type packages have been proposed to realize thin semiconductor packages. Recently, multi-functional electronic devices operating at a high speed with a large capacity of memory are increasingly desirable. In order to implement high performance semiconductor devices, a single package may include a plurality of semiconductor chips or a plurality of integrated circuit chips. Thus, various package technologies have been developed to increase the number of chips.

SUMMARY

Various embodiments are directed to chip stack embedded packages.

According to some embodiments, a chip stack embedded package includes a first dielectric layer including a multistep cavity, the multistep cavity having a first level, a second level above the first level, and a step-shaped sidewall with a first step, a first plurality of semiconductor chips disposed in the first level, a second plurality of semiconductor chips disposed in the second level, a first portion of a first semiconductor chip of the second plurality of semiconductor chips overlapping with a portion of a corresponding semiconductor chip of the first plurality of semiconductor chips, a second portion of the first semiconductor chip of the second plurality of semiconductor chips overlapping with the first step, and a second dielectric layer filling the multistep cavity to cover the first and second pluralities of semiconductor chips.

According to further embodiments, a chip stack embedded package includes a first dielectric layer having a multistep cavity therein, the multistep cavity including a first level of the cavity, a second level of the cavity above the first level, a third level of the cavity above the second level, and a step-shaped sidewall having a first step and a second step, the second level having a width that is wider than a width of the first level, the third level having a width that is wider than the width of the second level, a first plurality of semiconductor chips disposed in the first level, the first plurality of semiconductor chips having first connectors on surfaces thereof, a second plurality of semiconductor chips disposed in the second level, a portion of a semiconductor chip of the second plurality of semiconductor chips overlapping with a portion of a semiconductor chip of the first plurality of semiconductor chips, a second portion of the semiconductor chip of the second plurality of semiconductor chips overlapping with the first step, the second plurality of semiconductor chips having first through electrodes connected to the first connectors, a third plurality of semiconductor chips disposed in the third level of such that a first portion of a semiconductor chip of the third plurality of semiconductor chips overlaps with a portion of a semiconductor chip of the second plurality of semiconductor chips and a second portion of the semiconductor chip of the third plurality of semiconductor chips overlaps with the second step, the third plurality of semiconductor chips having second through electrodes connected to the first through electrodes, and a second dielectric layer filling the multistep cavity to cover the first, second, and third pluralities of semiconductor chips.

According to further embodiments, A chip stack embedded package includes a first dielectric layer having a multistep cavity therein, the multistep cavity including a first level of the cavity, a second level of the cavity above the first level, and a step-shaped sidewall with a first step under the second level, a first plurality of semiconductor chips and a second plurality of semiconductor chips disposed in the first level and the second level, respectively, and a second dielectric layer filling the multistep cavity to cover the first and second pluralities of semiconductor chips. A semiconductor chip of the second plurality of semiconductor chips overlaps with two neighboring end portions of two neighboring chips of the first plurality of semiconductor chips.

A memory card includes a memory and a memory controller that controls operations of the memory. The memory includes a first dielectric layer having a multistep cavity therein, the multistep cavity including a first level of the cavity, a second level of the cavity above the first level, a width of the second level being wider than a width of the first level, and a step-shaped sidewall with a first step, a first plurality of semiconductor chips disposed in the first level, a second plurality of semiconductor chips disposed in the second level such that a first portion of a semiconductor chip of the second plurality of semiconductor chips overlaps with a portion of a semiconductor chip of the first plurality of semiconductor chips and a second portion of the semiconductor chip of the second plurality of semiconductor chips overlaps with the first step, and a second dielectric layer filling the multistep cavity to cover the first and second pluralities of semiconductor chips.

According to further embodiments, a memory card includes a memory and a memory controller that controls operations of the memory. The memory includes a first dielectric layer having a multistep cavity therein. The multistep cavity includes a first stage of cavity, a second stage of cavity disposed on the first stage of cavity to be wider than the first stage of cavity, a third stage of cavity disposed on the second stage of cavity to be wider than the second stage of cavity, and a step-shaped sidewall providing a first step and a second step. A first stage of semiconductor chip is disposed in the first stage of cavity. The first stage of semiconductor chip has first connectors on a surface thereof. A second stage of semiconductor chip is disposed in the second stage of cavity such that a portion of the second stage of semiconductor chip overlaps with the first stage of semiconductor chip and another portion of the second stage of semiconductor chip overlaps with the first step. The second stage of semiconductor chip has first through electrodes connected to the first connectors. A third stage of semiconductor chip is disposed in the third stage of cavity such that a portion of the third stage of semiconductor chip overlaps with the second stage of semiconductor chip and another portion of the third stage of semiconductor chip overlaps with the second step. The third stage of semiconductor chip has second through electrodes connected to the first through electrodes. A second dielectric layer fills the multistep cavity to cover the first, second and third stages of semiconductor chips.

According to further embodiments, a memory card includes a memory and a memory controller that controls operations of the memory. The memory includes a first dielectric layer having a multistep cavity therein. The multistep cavity includes a first stage of cavity, a second stage of cavity on the first stage of cavity, and a step-shaped sidewall providing a step under an edge of the second stage of cavity. A first stage of semiconductor chip and a second stage of semiconductor chip are disposed in the first stage of cavity and the second stage of cavity, respectively. A second dielectric layer fills the multistep cavity to cover the first and second stages of semiconductor chips. Any one of chips constituting the second stage of semiconductor chip is disposed to overlap with two adjacent edges of two neighboring chips of the first stage of semiconductor chip.

According to further embodiments, an electronic system includes a memory and a controller coupled to the memory via a bus. The memory or the controller includes a memory and a memory controller that controls operations of the memory. The memory includes a first dielectric layer having a multistep cavity therein, a first stage of semiconductor chip and a second stage of semiconductor chip disposed in the multistep cavity, and a second dielectric layer filling the multistep cavity to cover the first and second stages of semiconductor chips. The multistep cavity includes a first stage of cavity, a second stage of cavity disposed on the first stage of cavity to be wider than the first stage of cavity, and a step-shaped sidewall providing a first step. The first stage of semiconductor chip is disposed in the first stage of cavity, and the second stage of semiconductor chip is disposed in the second stage of cavity. A portion of the second stage of semiconductor chip overlaps with the first stage of semiconductor chip and another portion of the second stage of semiconductor chip overlaps with the first step.

According to further embodiments, an electronic system includes a memory and a controller coupled to the memory via a bus. The memory or the controller includes a first dielectric layer having a multistep cavity therein. The multistep cavity includes a first stage of cavity, a second stage of cavity disposed on the first stage of cavity to be wider than the first stage of cavity, a third stage of cavity disposed on the second stage of cavity to be wider than the second stage of cavity, and a step-shaped sidewall providing a first step and a second step. A first stage of semiconductor chip is disposed in the first stage of cavity. The first stage of semiconductor chip has first connectors on a surface thereof. A second stage of semiconductor chip is disposed in the second stage of cavity such that a portion of the second stage of semiconductor chip overlaps with the first stage of semiconductor chip and another portion of the second stage of semiconductor chip overlaps with the first step. The second stage of semiconductor chip has first through electrodes connected to the first connectors. A third stage of semiconductor chip is disposed in the third stage of cavity such that a portion of the third stage of semiconductor chip overlaps with the second stage of semiconductor chip and another portion of the third stage of semiconductor chip overlaps with the second step. The third stage of semiconductor chip has second through electrodes connected to the first through electrodes. A second dielectric layer fills the multistep cavity to cover the first, second and third stages of semiconductor chips.

According to further embodiments, an electronic system includes a memory and a controller coupled to the memory via a bus. The memory or the controller includes a first dielectric layer having a multistep cavity therein. The multistep cavity includes a first stage of cavity, a second stage of cavity on the first stage of cavity, and a step-shaped sidewall providing a step under an edge of the second stage of cavity. A first stage of semiconductor chip and a second stage of semiconductor chip are disposed in the first stage of cavity and the second stage of cavity, respectively. A second dielectric layer fills the multistep cavity to cover the first and second stages of semiconductor chips. Any one of chips constituting the second stage of semiconductor chip is disposed to overlap with two adjacent edges of two neighboring chips of the first stage of semiconductor chip.

BRIEF DESCRIPTION OF THE DRAWINGS

Embodiments will become more apparent in view of the attached drawings and accompanying detailed description, in which.

DETAILED DESCRIPTION

It will be understood that although the terms first, second, third etc. may be used herein to describe various elements, these elements should not be limited by these terms. These terms are used to distinguish one element from another element. Thus, a first element in some embodiments could be termed a second element in other embodiments and have the same characteristics.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. Semiconductor chips of this disclosure may be obtained by separating a semiconductor substrate having a plurality of integrated circuits into a plurality of pieces using a die sawing process.

The semiconductor chips may correspond to memory chips or non-memory chips. The memory chips may include dynamic random access memory (DRAM) circuits, static random access memory (SRAM) circuits, flash circuits, magneto-resistive random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The non-memory chips may include logic circuits or analog circuits, which are integrated on and/or in the semiconductor substrate. In some cases, the term "semiconductor substrate" used herein may be construed as a semiconductor chip or a semiconductor die in which integrated circuits are formed.

Chip embedded packages are proposed to realize thin semiconductor packages. The chip embedded package may be fabricated by embedding a semiconductor chip in a dielectric layer. The chip embedded package may include a passive device or an active device embedded in a substrate. The chip embedded packages are proposed to include multi-functional electronic devices operating at a high speed with a large capacity of memory. In order to implement high performance semiconductor devices, a single embedded package may include a plurality of semiconductor chips or a plurality of integrated circuit chips. The chip embedded packages includes increased number of chips, which are embedded in a substrate.

Figure 1:
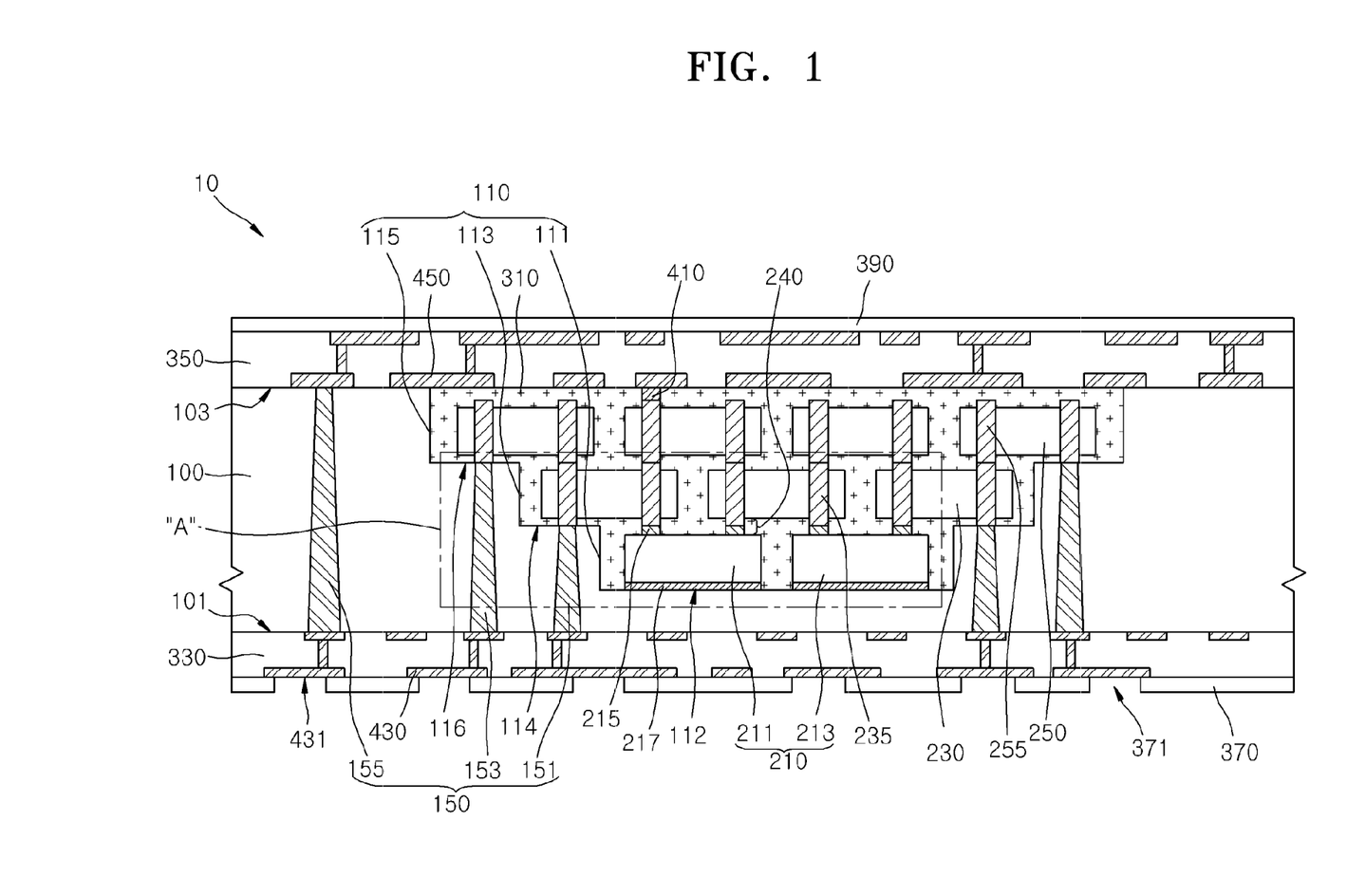
FIG. 1 is a cross-sectional view illustrating a chip stack embedded package according to an embodiment.

Referring to FIG. 1, an embedded package 10 may include a first dielectric layer 100 having a multistep cavity 110 therein, first, second, and third pluralities of semiconductor chips 210, 230, and 250 disposed in the multistep cavity 110, and a second dielectric layer 310 filling the multistep cavity 110. The first dielectric layer 100 may correspond to a body of a package substrate. The second dielectric layer 310 may fill the multistep cavity 110 in which the semiconductor chips 210, 230, and 250 are embedded.

Some of first circuit patterns 430 serving as interconnection lines of the package substrate may be disposed on a first surface 101 of the first dielectric layer 100. Some of second circuit patterns 450 that are as interconnection lines of the package substrate may be disposed on a second surface 103 of the first dielectric layer 100, which is opposite to the first surface 101. These first and second circuit patterns 430 and 450 may be electrically connected to the semiconductor chips 210, 230, and 250 embedded in the first and second dielectric layers 100 and 310. As a result, the semiconductor chips 210, 230, and 250 output or receive electrical signals through the electrically connected circuit patterns 430 and 450.

A third dielectric layer 330 may be disposed on the first surface 101 of the first dielectric layer 100. Some of the first circuit patterns 430 serving as contact pads or interconnection lines may be disposed at an interface between the first and third dielectric layers 100 and 330. That is, these first circuit patterns 430 may be disposed on the top surface of the third dielectric layer 330. Some of the first circuit patterns 430 may be disposed on the bottom surface of the third dielectric layer 330. As a result, the first circuit patterns 430 disposed on the top and bottom surfaces of the third dielectric layer 330 to have a multi-layer interconnection structure. That is, the first circuit patterns 430 on the top surface of the third dielectric layer 330 may be electrically connected to the first circuit patterns 430 on the bottom surface of the third dielectric layer 330 by through via plugs, which vertically penetrate the third dielectric layer 330. The multi-layer interconnection structure may include a metal material such as copper. The first circuit patterns 430 included in the multi-layer interconnection structure may correspond to redistribution interconnection lines. Conductive patterns including the first circuit patterns 430 may be disposed on the top and bottom surfaces of the third dielectric layer 330 and/or may be embedded in the third dielectric layer 330.

A fourth dielectric layer 350 may be disposed on the second surface 103 of the first dielectric layer 100. Some of the second circuit patterns 450 serving as contact pads or interconnection lines may be disposed at an interface between the first and fourth dielectric layers 100 and 350. That is, these second circuit patterns 450 may be disposed on opposing top and bottom surfaces of the fourth dielectric layer 350. Some of the second circuit patterns 450 may be disposed on the top surface of the fourth dielectric layer 350 to have a multi-layer interconnection structure. That is, the second circuit patterns 450 on the top surface of the fourth dielectric layer 350 may be electrically connected to the second circuit patterns 450 on the bottom surface of the fourth dielectric layer 350 by through via plugs, which vertically penetrate the fourth dielectric layer 350. Conductive patterns including the second circuit patterns 450 may be disposed on the top and bottom surfaces of the fourth dielectric layer 350 or may be embedded in the fourth dielectric layer 350.

A first protection layer 370 may be disposed on the bottom surface of the third dielectric layer 330 to cover and protect the first circuit patterns 430. The first protection layer 370 may include a solder resist material. The first protection layer 370 may include opening windows 371 that expose contact portions 431 of the first circuit patterns 430, which are disposed on the bottom surface of the third dielectric layer 330. The contact portions 431 may be electrically connected to an external device or an external module substrate. Each of a plurality of connection members such as solder balls may be attached to a corresponding contact portion 431. A second protection layer 390 may be disposed on the top surface of the fourth dielectric layer 350 to cover and protect the second circuit patterns 450.

Figure 2:
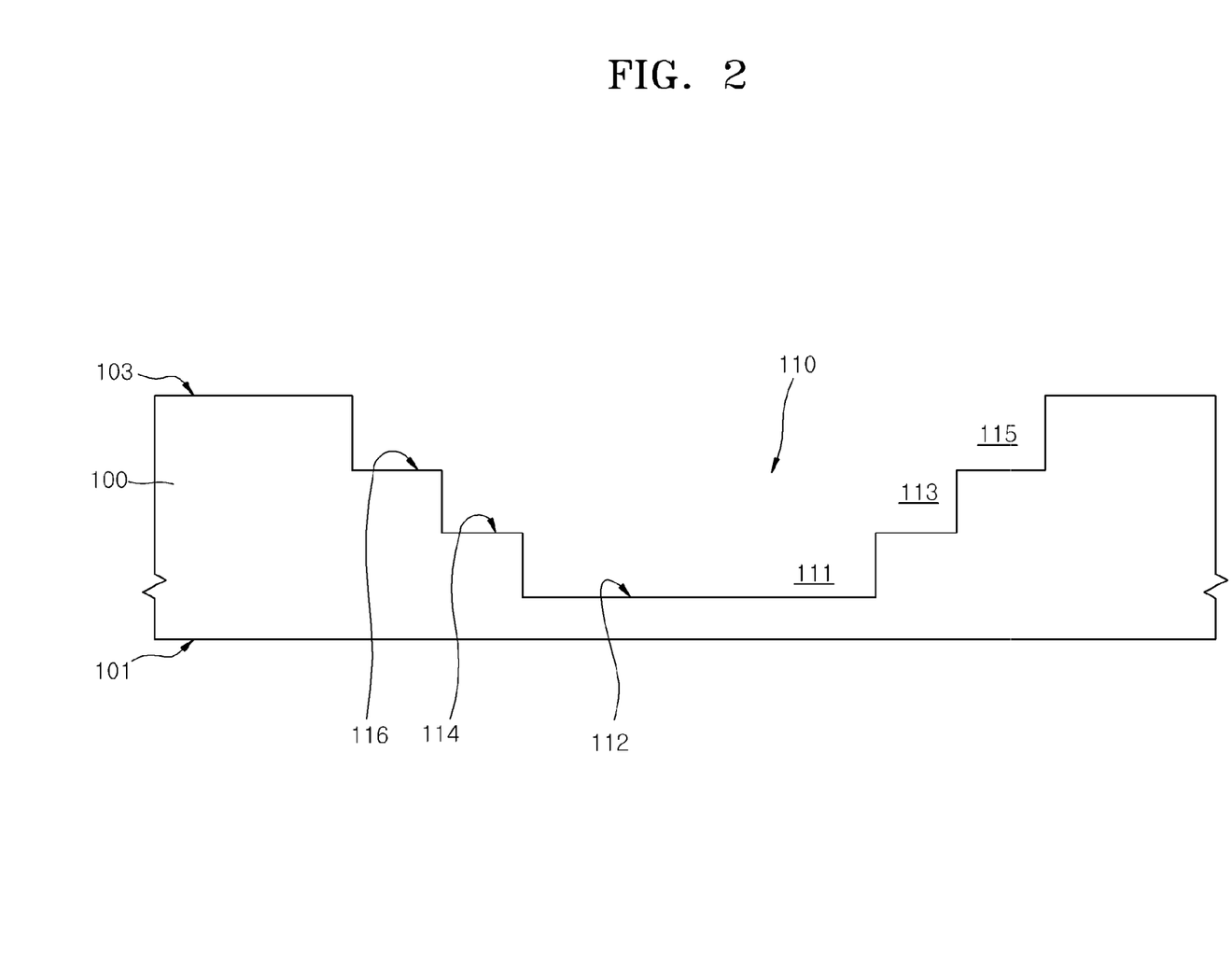
FIG. 2 is a cross-sectional view illustrating a first dielectric layer having a multistep cavity employed in the chip stack embedded package of FIG. 1.

Referring to FIGS. 1 and 2, the multistep cavity 110 in the first dielectric layer 100 may be formed to have a stepped shape that is recessed from the second surface 103 of the first dielectric layer 100 in a plurality of steps. For example, the multistep cavity 110 may be formed by performing an etching process on the second surface 103 of the first dielectric layer 100 to form a bottom surface 112 of the multistep cavity 110. In an embodiment, the multistep cavity 110 has step-shaped sidewalls including first and second steps 114 and 116, which correspond to horizontal surfaces extending in the perpendicular direction with respect to the orientation of FIG. 2. For example, the multistep cavity 110 may include a first level of cavity 111 and a second level of cavity 113 above the first level of cavity 111. The width of the second level of cavity 113 along the horizontal direction with respect to the orientation of FIG. 2 is be wider than the width of the first level of cavity 111. In addition, the multistep cavity 110 may further include a third level of cavity 115 above the second level of cavity 113. The width of the third level of cavity 115 is wider than the width of the second stage of cavity 113, as illustrated in FIG. 2. Although not shown in the drawings, the multistep cavity 110 may include four or more levels of cavity.

Since the second level of cavity 113 is above the first level of cavity 111, first steps 114 may be provided under end portions of the second level of cavity 113. Similarly, since the third level of cavity 115 is above the second level of cavity 113, second steps 116 may be provided under end portions of the third level of cavity 115. The first and second steps 114 and 116 may be used as supporting portions of some of the semiconductor chips 230 and 250, which are disposed in the second and third levels of cavity 113 and 115, respectively.

The first to third levels of cavities 111, 113, and 115 may have a sufficient height that one or more semiconductor chips can be disposed in a corresponding one of the first to third levels 111, 113, and 115. Thus, the semiconductor chips 210, 230, and 250 disposed in the first to third levels of cavities 111, 113, and 115 may have a stacked structure embedded in in the first and second dielectric layers 100 and 310.

Figure 3:
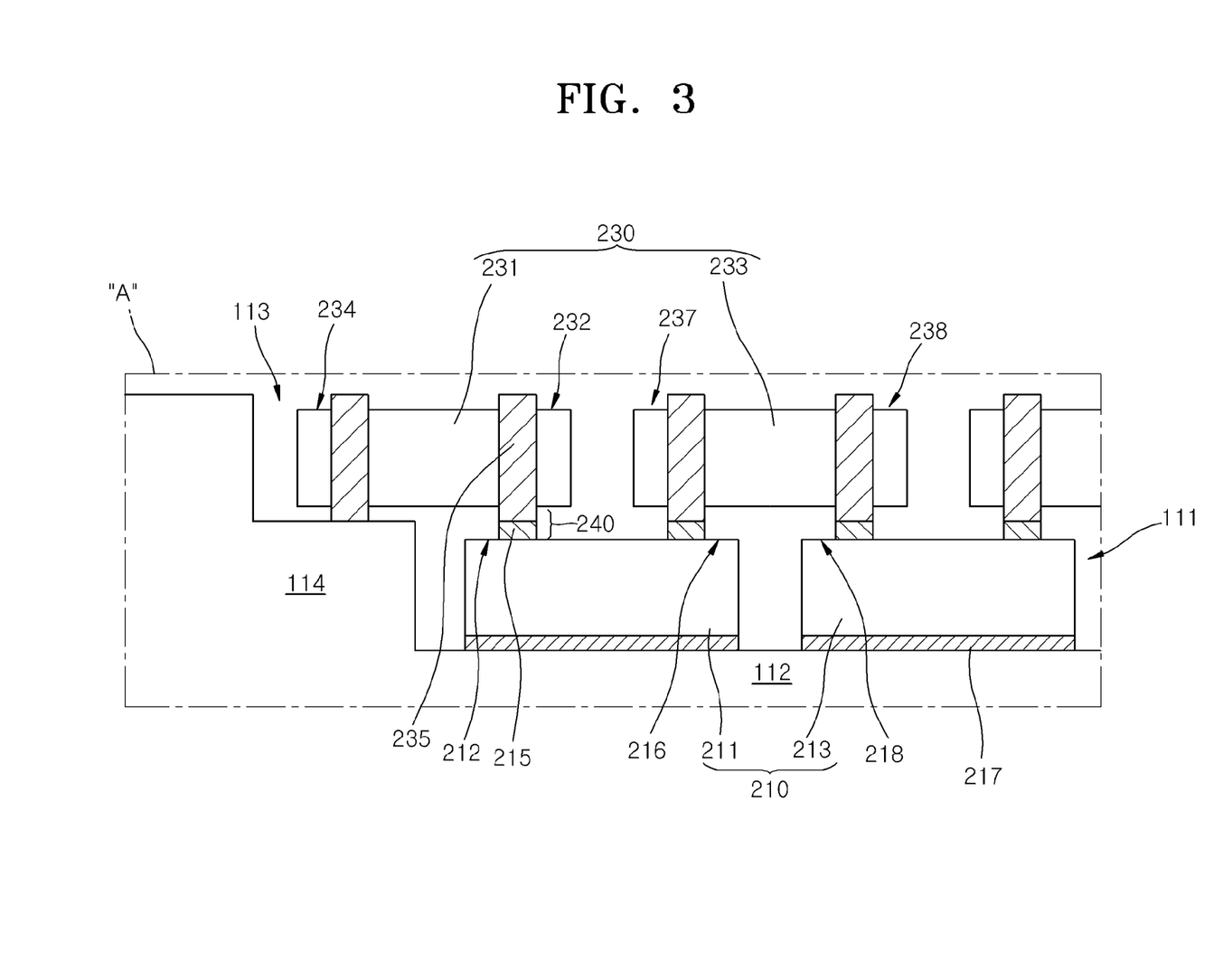
FIG. 3 is an enlarged view illustrating a portion "A" of FIG. 1.

Referring to FIGS. 1 and 3, a first plurality of semiconductor chips 210 may be disposed in the first level of cavity 111. The first plurality of semiconductor chips 210 may be attached to the bottom surface 112 of the first level of cavity 111 using an adhesive layer 217. The adhesive layer 217 may include an epoxy adhesive or may be a film such as a wafer backside lamination (WBL) layer. The first plurality of semiconductor chips 210 may be attached to the bottom surface 112 of the first level of cavity 111 using a thermal pressing process or a mechanical pressing process with the adhesive layer 217. If the first plurality of semiconductor chips 210 includes two or more chips, these chips 210 may be arranged in a single dimensional line or a two dimensional matrix in the first level of cavity 111.

In an embodiment, a logic chip such as a controller chip controlling operations of a plurality of NAND-type flash memory chips may be disposed in the first level of cavity 111. In an embodiment, an analog chip may also be disposed in the first level of cavity 111. The first level of cavity 111 may have a plane on which a first chip 211 and a second chip 213 of the first plurality of semiconductor chips 210 are disposed side-by-side. If the first plurality of semiconductor chips 210 includes three or more chips, the first level of cavity 111 may have a plane on which the three or more chips of the first plurality of semiconductor chips 210 are disposed side-by-side.

A second plurality of semiconductor chips 230 may be disposed in the second level of cavity 113. Some portions of the second plurality of semiconductor chips 230 may be stacked over the first level of semiconductor chip 210 to overlap with corresponding portions of the first plurality of semiconductor chips 210 in a plan view. As illustrated in FIG. 3, a first chip 231 of the second plurality of semiconductor chips 230 may be stacked over the first chip 211 of the first plurality of semiconductor chips 210 such that a second end portion 232 of the first chip 231 overlaps with a first end portion 212 of the first chip 211 of the first plurality of semiconductor chip 210 in a plan view. In other words, the first end portion 212 horizontally overlaps with or is disposed directly over a second end portion 232.

A third end portion 234 of the first chip 231, which is opposite to the second end portion 232, may be disposed over a corresponding first step 114. Thus, the vertical center line of the first chip 231 of the second plurality of semiconductor chips 230 may be offset with respect to the vertical center line of the first chip 211 of the first plurality of semiconductor chips 210. As a result, the first chip 231 may be stacked over the first chip 211 to have a step shape, and first chip 211 is offset from first chip 231.

A second chip 233 of the second plurality of semiconductor chip 230 may be disposed side-by-side with the first chip 231. Fourth and fifth end portions 237 and 238 of the second chip 233 overlap with a sixth end portion 216 of the first chip 211 and a seventh end portion 218 of the second chip 213, respectively, in a plan view. That is, the fourth end portion 237 of the second chip 233 of the second plurality of semiconductor chips 230 may overlap with the sixth end portion 216 of the first chip 211 of the first plurality of semiconductor chips 210 in a plan view. The fifth end portion 238 of the second chip 233 of the second plurality of semiconductor chips 230 may overlap with the seventh end portion 218 of the second chip 213 of the first plurality of semiconductor chips 210 in a plan view. As such, an end portion of a chip included in the second plurality of semiconductor chips 230 may be disposed to overlap with an end portion of a chip included in the first plurality of semiconductor chips 210.

Referring again to FIG. 1, a third plurality of semiconductor chips 250 may include a plurality of chips, which are disposed side-by-side in the third level of cavity 115. Two opposing end portions of each chip of the second plurality of semiconductor chips 230 may overlap with two neighboring end portions of two neighboring chips of the third level of semiconductor chip 250. In addition, an end portion of an outermost chip of the third plurality of semiconductor chips 250 may be disposed over a corresponding second step 116.

Referring again to FIGS. 1 and 3, the multistep cavity 110 may have step-shaped sidewalls, and the second and third pluralities of semiconductor chips 230 and 250 may be disposed in the multistep cavity 110 such that end portions of the outermost second and third pluralities of semiconductor chips 230 and 250 are disposed over the first steps 114 and the second steps 116. The second plurality of semiconductor chips 230 may be stacked over the first plurality of semiconductor chips 210, and the third plurality of semiconductor chips 250 may be stacked over the second plurality of semiconductor chips 230 to have a step structure. Thus, the number of chips included in an upper level of the multistep cavity 110 may be greater than the number of chips included in a lower level of the multistep cavity 110. As a result, the number of chips embedded in the embedded package 10 that has the multistep cavity 110 may be increased compared to an embedded package including a cavity that has one level of semiconductor chips, or compared to a cavity having even sidewalls without steps.

Referring again to FIG. 3, inter-chip connectors 240 may be disposed in overlap regions between the end portions of the chips included in the first and second pluralities of semiconductor chips 210 and 230 to electrically connect the first plurality of semiconductor chips 210 to the second plurality of semiconductor chips 230. Each of the inter-chip connectors 240 may include a bump 215. In an embodiment, bumps 215 may be disposed on top surfaces of the first plurality of semiconductor chips 210 and on bottom surfaces of the second plurality of semiconductor chips 230.

As a result, first through electrodes 235 penetrating the second plurality of semiconductor chips 230 are vertically aligned with the bumps 215. The first through electrodes 235 may be coupled to the bumps 215, using a conductive adhesive layer such as a solder material. Accordingly, the first through electrodes 235 may be electrically connected to the bumps 215. The first through electrodes 235 may be through silicon via (TSV) electrodes penetrating the second plurality of semiconductor chips 230. In some embodiments, the second plurality of semiconductor chips 230 may include a plurality of bumps on surfaces thereof instead of the first through electrodes 235.

Each of the chips of the first plurality of semiconductor chips 210 may be electrically connected to two or more overlapping chips of the second plurality of semiconductor chips 230 by the inter-chip connectors 240. Thus, the two or more neighboring chips of the second plurality of semiconductor chips 230 may be electrically connected to each other through a single chip of the first plurality of semiconductor chips 210. In addition, as illustrated in FIG. 1, each of the chips of the second plurality of semiconductor chips 230 may be electrically connected to two or more overlapping chips of the third plurality of semiconductor chips 250 by the inter-chip connectors 240.

Thus, the two or more neighboring chips of the third plurality of semiconductor chips 250 may be electrically connected to each other through a single chip of the second plurality of semiconductor chips 230. In an embodiment, the third plurality of semiconductor chips 250 may be stacked over the second plurality of semiconductor chips 230 such that second through electrodes 255 penetrating the third plurality of semiconductor chips 250 are coupled to the first through electrodes 235 penetrating the second plurality of semiconductor chips 230. As a result, the second and third pluralities of semiconductor chips 230 and 250 may be electrically connected to each other using the first and second through electrodes 235 and 255.

Referring again to FIG. 1, in order to electrically connect the second and third pluralities of semiconductor chips 230 and 250 to some of the first circuit patterns 430 disposed on the first surface 101 of the first dielectric layer 100, first and second through via electrodes 151 and 153 may penetrate the first dielectric layer 100. The first through via electrodes 151 may reach the first steps 114 to electrically connect the first through electrodes 235 on the first steps 114 to the corresponding first circuit patterns 430. The second through via electrodes 153 may reach the second steps 116 to electrically connect the second through electrodes 255 on the second steps 116 to first circuit patterns 430. In addition, third through via electrodes 155 may reach the second surface 103 of the first dielectric layer 100 to electrically connect some of the first circuit patterns 430 to second circuit patterns 450. Each of the through via electrodes 150 including the first, second, and third through via electrodes 151, 153, and 155 may penetrate the first dielectric layer 100.

The second dielectric layer 310 may fill the multistep cavity 110 to cover and protect the semiconductor chips 210, 230, and 250 disposed in the multistep cavity 110. A top surface of the second dielectric layer 310 may be coplanar with the second surface 103 of the first dielectric layer 100. Some patterns of the second circuit patterns 450 may be disposed directly on the top surface of the second dielectric layer 310. Alternatively, an intervening layer (not shown) may be present between the second circuit patterns 450 and the second dielectric layer 310. At least one via electrode 410 may be disposed in the second dielectric layer 310 to electrically connect at least one of the second through electrodes 255 to the second circuit patterns 450.

The first and second dielectric layers 100 and 310 may serve as a body of a package substrate of the embedded package 10. The first to third pluralities of semiconductor chips 210, 230, and 250 may be embedded in the body of the package substrate of the embedded package 10 to have a step structure. The first to third pluralities of semiconductor chips 210, 230, and 250 may be stacked in an inverted pyramid shape. Outer end portions of the outermost chips of the second plurality of semiconductor chips 230 may be disposed over the first steps 114 of the first dielectric layer 100. Outer end portions of the outermost chips of the third plurality of semiconductor chips 250 may be disposed over the second steps 116 of the first dielectric layer 100. The embedded package 10 may be formed using a reduced thickness compared to an embedded package including a cavity that has one level of semiconductor chips, because the first to third pluralities of semiconductor chips 210, 230, and 250 are stacked in the multistep cavity 110 to have a step structure.

As illustrated in FIG. 1, the semiconductor chips 230 and 250 are embedded in the second dielectric layer 310. That is, the second dielectric layer 310 covers both top and bottom surfaces of at least a portion of the semiconductor chips. A first bending moment may result from a difference in thermal expansion between the semiconductor chip and a portion of the second dielectric layer 310 on the top surface of the semiconductor chip, and a second bending moment may result from a difference in thermal expansion between the semiconductor chip and a portion of the second dielectric layer 310 on the bottom surface of the semiconductor chip. Since the first and second bending moments are opposite in direction, the total bending moment on the embedded package 10 is reduced compared to that in a chip package where a dielectric layer is disposed on either a top surface or a bottom surface of the semiconductor chip.

Moreover, the chip stack embedded package 10 may have the improved endurance and resistance against warpage because a plurality of semiconductor chips in an upper level of the multistep cavity 110 are vertically misaligned with a plurality of semiconductor chips in a lower level of the multistep cavity 110. That is, the embedded package 10 including the vertically misaligned semiconductor chips has a bending resistance that is greater than that of a chip package in which embedded semiconductor chips are vertically aligned. Accordingly, even when a thickness of the chip stack embedded package 10 is reduced, warpage of the chip stack embedded package 10 may be suppressed.

Figure 4:
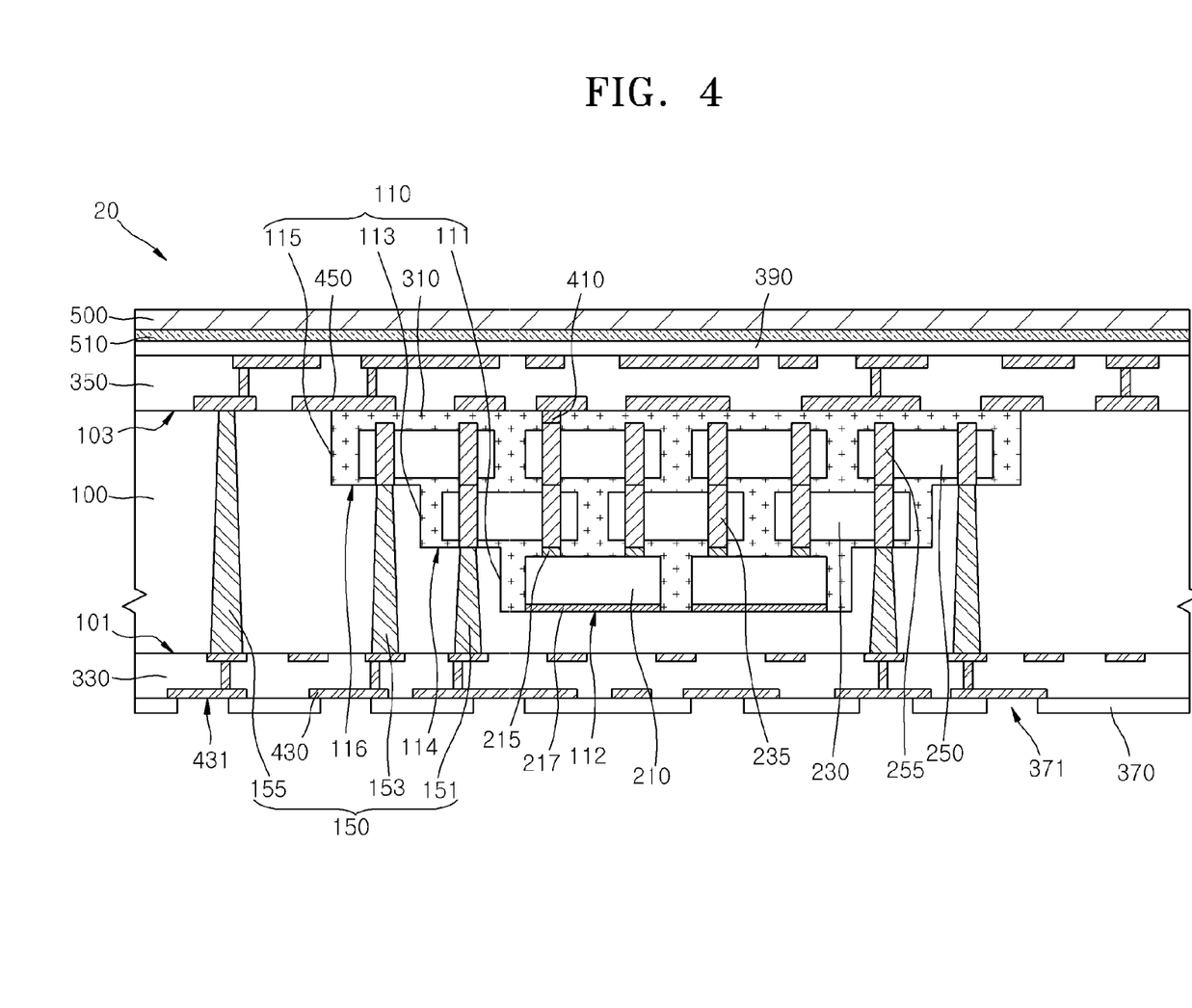
FIG. 4 is a cross-sectional view illustrating a chip stack embedded package according to an embodiment.

FIG. 4 is a cross-sectional view illustrating a chip stack embedded package 20 according to an embodiment. In FIG. 4, the same reference numerals as used in FIGS. 1, 2, and 3 refer to the same elements. Thus, detailed descriptions of the same elements as set forth with reference to FIGS. 1, 2, and 3 will be omitted.

Referring to FIG. 4, the chip stack embedded package 20 may include a first dielectric layer 100 having a multistep cavity 110 therein, a stack structure of semiconductor chips 210, 230, and 250 disposed in the multistep cavity 110, and a second dielectric layer 310 filling the multistep cavity 110. One or more chips of a first plurality of semiconductor chips 210 may be mounted on a bottom surface 112 of a first level of cavity 111 of the multistep cavity 110, and one or more chips of a second plurality of semiconductor chips 230 may be disposed in a second level of cavity 113 of the multistep cavity 110. Furthermore, one or more chips of a third plurality of semiconductor chips 250 may be disposed in a third level of cavity 115 of the multistep cavity 110. An outer end portion of an outermost chip of the third plurality of semiconductor chips 250 may be disposed on one of the second steps 116, and an outer end portion of an outermost chip of the second plurality of semiconductor chip 230 may be disposed on one of the first steps 114.

A third dielectric layer 330 including first circuit patterns 430 may be disposed on a first surface 101 of the first dielectric layer 100. A first protection layer 370 having opening windows 371 that expose contact portions 431 of the first circuit patterns 430 may be disposed on a bottom surface of the third dielectric layer 330. A fourth dielectric layer 350 including second circuit patterns 450 may be disposed on a second surface 103 of the first dielectric layer 100 opposite to the first surface 101. A second protection layer 390 may be disposed on a top surface of the fourth dielectric layer 350. A heat spreading layer 500 may be attached to the second protection layer 390 using an adhesive layer 510. The heat spreading layer 500 may be a metal film.

Alternatively, the heat spreading layer 500 may be one of various heat radiators having diverse configurations. If the package 20 includes the heat spreading layer 500, the rigidity of the package 20 may be improved. That is, the heat spreading layer 500 may increase the total bending resistance of the package 20 to improve the resistance against warpage. In some embodiments, the heat spreading layer 500 may be replaced with a rigid layer having an elastic modulus which is higher than that of the first dielectric layer 100.

Figure 5:
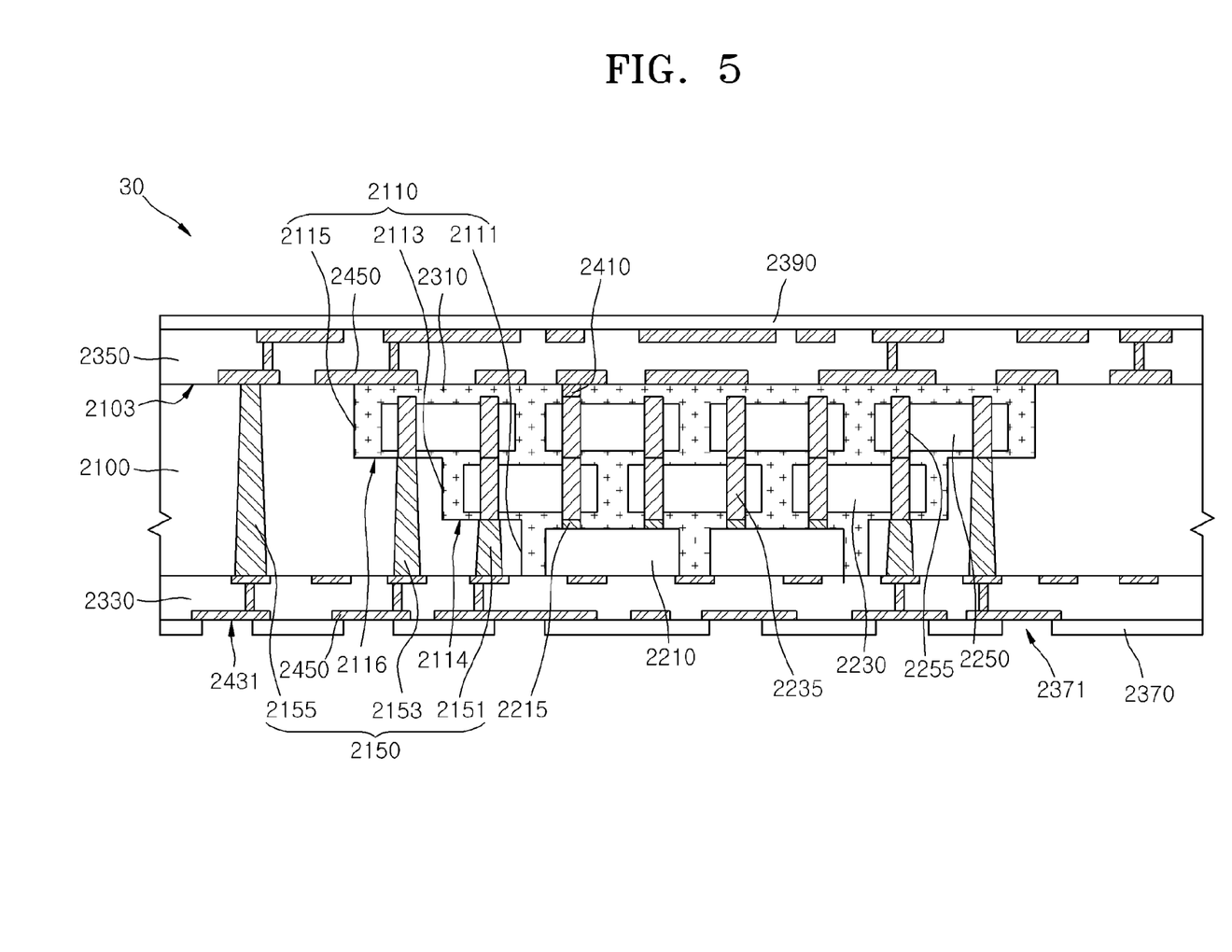
FIG. 5 is a cross-sectional view illustrating a chip stack embedded package according to an embodiment.
Figure 6:
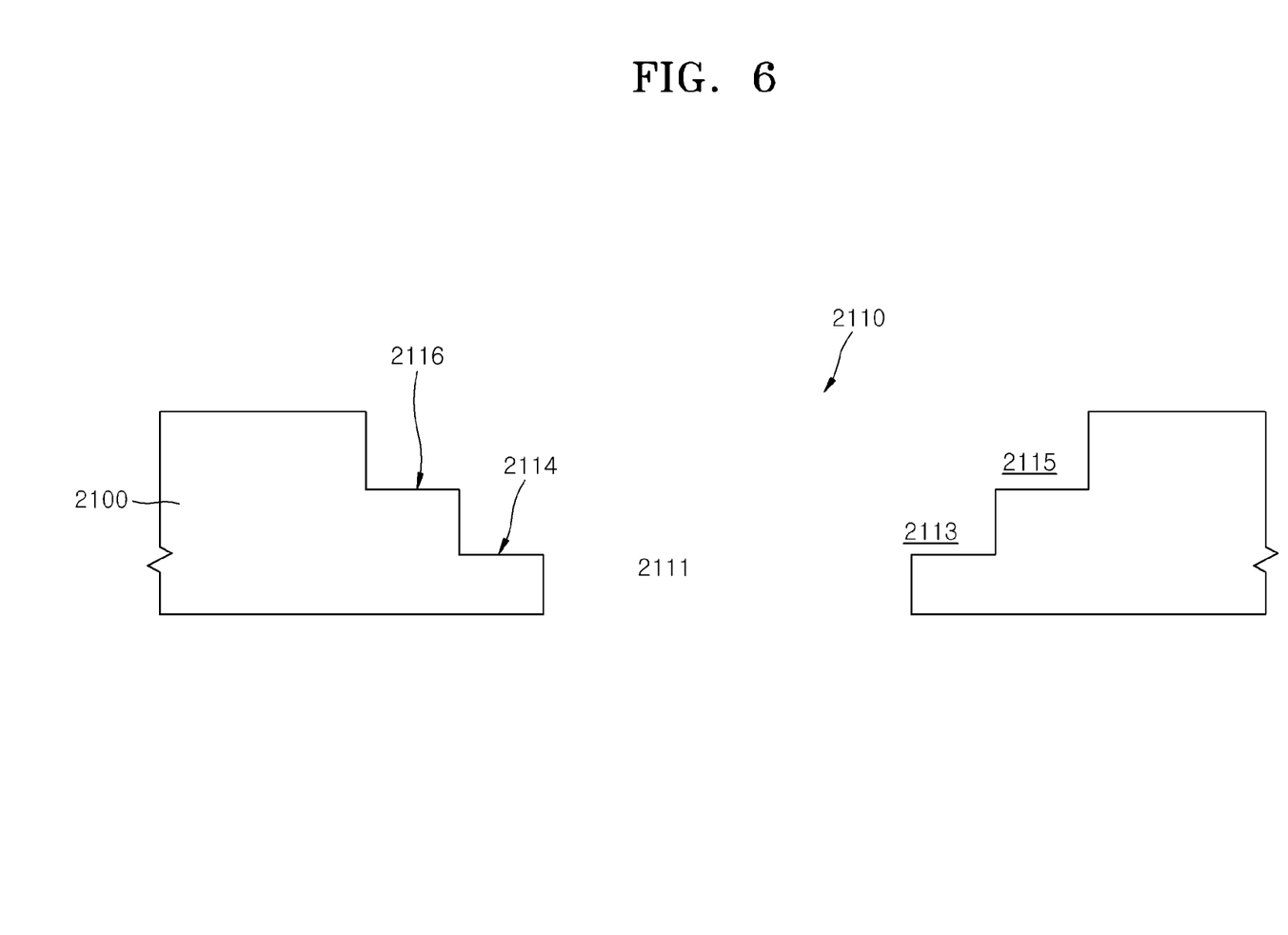
FIG. 6 is a cross-sectional view illustrating a first dielectric layer having a multistep cavity employed in the chip stack embedded package of FIG. 5.

FIG. 5 is a cross-sectional view illustrating a chip stack embedded package 30 according to an embodiment, and FIG. 6 is a cross-sectional view illustrating a first dielectric layer 2100 in the chip stack embedded package 30 of FIG. 5.

Referring to FIGS. 5 and 6, the chip stack embedded package 30 may include a first dielectric layer 2100 having a multistep cavity 2110 therein, a stack structure of first to third pluralities of semiconductor chips 2210, 2230, and 2250 disposed in the multistep cavity 2110, and a second dielectric layer 2310 filling the multistep cavity 2110. One or more chips of the first plurality of semiconductor chips 2210 may be disposed in a first level of cavity 2111 of the multistep cavity 2110. One or more chips of the second plurality of semiconductor chips 2230 may be disposed in a second level of cavity 2113 of the multistep cavity 2110.

Furthermore, one or more chips of the third plurality of semiconductor chips 2250 may be disposed in a third level of cavity 2115 of the multistep cavity 2110. An outer end portion of an outermost chip of the third plurality of semiconductor chips 2250 may be disposed on one of second steps 2116. An outer end portion of an outermost chip of the second plurality of semiconductor chips 2230 may be disposed on one of the first steps 2114. The multistep cavity 2110 may penetrate the first dielectric layer 2100, as illustrated in FIG. 6.

A third dielectric layer 2330 including first circuit patterns 2430 may be disposed on a first surface 2101 of the first dielectric layer 2100. A first protection layer 2370 having opening windows 2371 that expose contact portions 2431 of the first circuit patterns 2430 may be disposed on a bottom surface of the third dielectric layer 2330. A fourth dielectric layer 2350 including second circuit patterns 2450 may be disposed on a second surface 2103 of the first dielectric layer 2100 opposite to the first surface 2101. A second protection layer 2390 may be disposed on a top surface of the fourth dielectric layer 2350.

First through via electrodes 2151 may penetrate the first dielectric layer 2100 to electrically connect first through electrodes 2235 of the second plurality of semiconductor chips 2230 to the first circuit patterns 2430. Second through via electrodes 2153 may penetrate the first dielectric layer 2100 to electrically connect second through electrodes 2255 of the third plurality of semiconductor chips 2250 to the first circuit patterns 2430. In addition, third through via electrodes 2155 may penetrate the first dielectric layer 2100 to electrically connect some of the second circuit patterns 2450 to the first circuit patterns 2430. Through via electrodes 2150 include the first, second, and third through via electrodes 2151, 2153, and 2155. Moreover, fourth through via electrodes 2410 may partially penetrate the second dielectric layer 2310 to electrically connect the second through electrodes 2255 of the third plurality of semiconductor chips 2250 to the second circuit patterns 2450.

Figure 7:
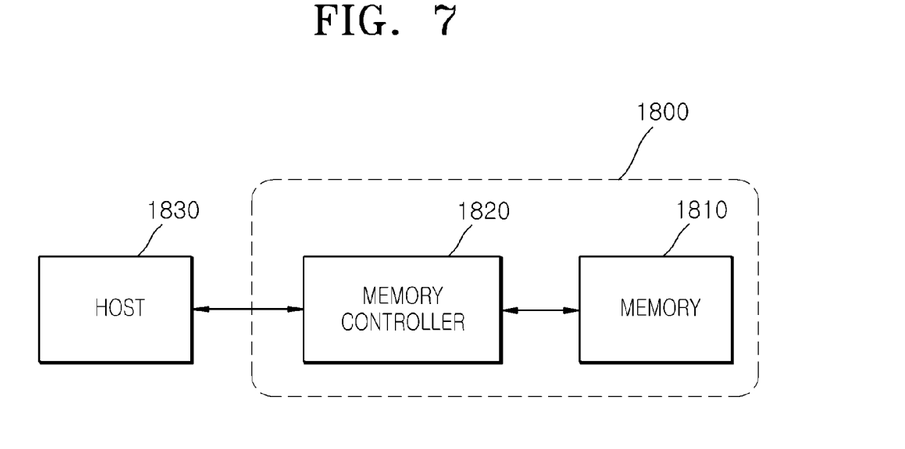
FIG. 7 is a block diagram illustrating an electronic system including a chip stack embedded package according to an embodiment.

Referring to FIG. 7, a chip stack embedded package in accordance with an embodiment may be applied to a memory card 1800. For example, the memory card 1800 may include a memory 1810 such as a nonvolatile memory device and a memory controller 1820. The memory 1810 and the memory controller 1820 may store data or read stored data.

The memory 1810 may include one or more nonvolatile memory devices to which an embodiment of the present disclosure is applied. The memory controller 1820 may receive a read/write request from a host 1830 and control the memory 1810 such that stored data is read out or data is stored in response to the read/write request.

Figure 8:
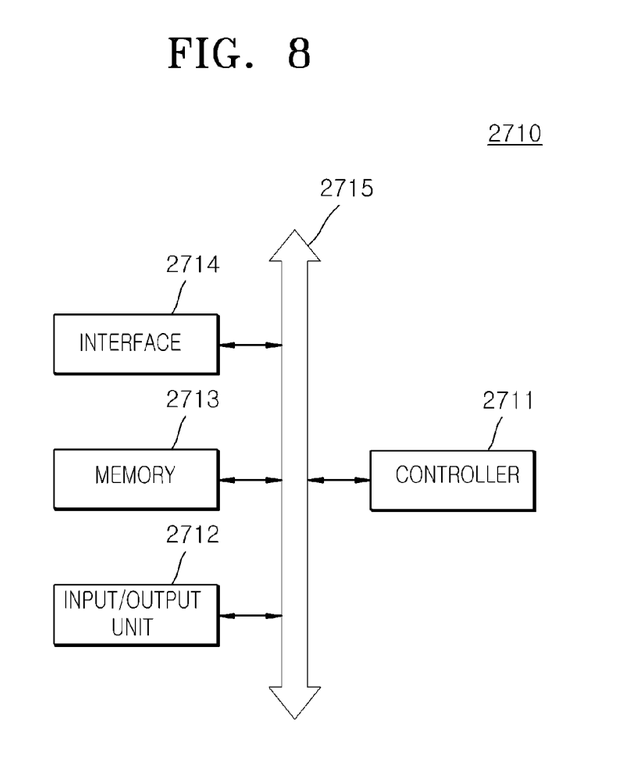
FIG. 8 is a block diagram illustrating an electronic system including a chip stack embedded package according to an embodiment.

Referring to FIG. 8, the chip stack embedded package in accordance with an embodiment may be applied to an electronic system 2710. The electronic system 2710 may include a controller 2711, an input/output device 2712, and a memory 2713. The controller 2711, the input/output device 2712 and the memory 2713 may be coupled with one another through a bus 2715 providing a path through which data are transmitted and/or received.

The controller 2711 may include one or more microprocessor, a digital signal processors, microcontrollers, and/or logic devices capable of performing the same functions as these components. The controller 2711 or the memory 2713 may include at least one selected from chip stack embedded packages according to embodiments of the present disclosure. The input/output device 2712 may include at least one selected among a keypad, a keyboard, a display device, a touchscreen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure as disclosed in the accompanying claims.

What is claimed is:

1. A chip stack embedded package comprising:
a first dielectric layer including a multistep cavity, the multistep cavity having a first level, a second level above the first level, and a step-shaped sidewall with a first step;
a first plurality of semiconductor chips disposed in the first level;
a second plurality of semiconductor chips disposed in the second level, a first portion of a first semiconductor chip of the second plurality of semiconductor chips overlapping with a portion of a corresponding semiconductor chip of the first plurality of semiconductor chips, a second portion of the first semiconductor chip of the second plurality of semiconductor chips overlapping with the first step; and a second dielectric layer filling the multistep cavity to cover the first and second pluralities of semiconductor chips.

2. The chip stack embedded package of claim 1, wherein the first plurality of semiconductor chips are disposed side-by-side in the first level of the cavity.

3. The chip stack embedded package of claim 2,
wherein the second plurality of semiconductor chips are disposed side-by-side in the second level of the cavity, and
wherein a second semiconductor chip of the second plurality of semiconductor chips overlaps with two neighboring end portions of two neighboring semiconductor chips of the first plurality of semiconductor chips.

4. The chip stack embedded package of claim 3, wherein an inter-chip connector is disposed in each overlapping region between the second plurality of semiconductor chips and the first plurality of semiconductor chips to electrically connect the first plurality of semiconductor chips to the second plurality of semiconductor chips.

5. The chip stack embedded package of claim 4, wherein the inter-chip connector includes a bump.

6. The chip stack embedded package of claim 4, wherein the inter-chip connector includes a through electrode penetrating a chip of the second plurality of semiconductor chips.

7. The chip stack embedded package of claim 1, further comprising:
first circuit patterns disposed on a first surface of the first dielectric layer; and
a first through via electrode reaching the first step to electrically connect a semiconductor chip of the second plurality of semiconductor chips to one of the first circuit patterns.

8. The chip stack embedded package of claim 7, further comprising a third dielectric layer in which the first circuit patterns are disposed,
wherein the first circuit patterns have a multi-layer interconnection structure.

9. The chip stack embedded package of claim 7, further comprising:
second circuit patterns disposed on a second surface of the first dielectric layer, the second surface being opposite to the first surface of the first dielectric layer; and
a second through via electrode penetrating the first dielectric layer to electrically connect one of the second circuit patterns to one of the first circuit patterns.

10. The chip stack embedded package of claim 9, further comprising a fourth dielectric layer in which the second circuit patterns are disposed,
wherein the second circuit patterns have a multi-layered interconnection structure.

11. The chip stack embedded package of claim 9, wherein a circuit pattern of the second circuit patterns is disposed on a surface of the second dielectric layer.

12. The chip stack embedded package of claim 11, further comprising a third through via electrode that penetrates the second dielectric layer to electrically connect the circuit pattern to a semiconductor chip of the second plurality of semiconductor chips.

13. The chip stack embedded package of claim 1, further comprising a heat spreading layer disposed over the first dielectric layer.

14. The chip stack embedded package of claim 13, wherein the heat spreading layer includes a metal film.

15. The chip stack embedded package of claim 1,
wherein the multistep cavity further includes a third level of the cavity above the second level, and
wherein a width of the third level is wider than a width of the second level such that the step-shaped sidewall includes a second step under an edge of the third level of the cavity.

16. The chip stack embedded package of claim 15, further comprising a third plurality of semiconductor chips disposed in the third level,
wherein a first portion of a semiconductor chip of the third plurality of semiconductor chips overlaps with a portion of a semiconductor chip of the second plurality of semiconductor chips, and
wherein a second portion of the semiconductor chip of the third plurality of semiconductor chips overlaps with the second step.

17. The chip stack embedded package of claim 1, further comprising an adhesive layer between a bottom surface of the first level and bottom surfaces of the first plurality of semiconductor chips.

18. The chip stack embedded package of claim 1, wherein the multistep cavity penetrates the first dielectric layer.

19. A chip stack embedded package comprising:
a first dielectric layer having a multistep cavity therein, the multistep cavity including a first level of the cavity, a second level of the cavity above the first level, a third level of the cavity above the second level, and a step-shaped sidewall having a first step and a second step, the second level having a width that is wider than a width of the first level, the third level having a width that is wider than the width of the second level;
a first plurality of semiconductor chips disposed in the first level, the first plurality of semiconductor chips having first connectors on surfaces thereof;
a second plurality of semiconductor chips disposed in the second level, a portion of a semiconductor chip of the second plurality of semiconductor chips overlapping with a portion of a semiconductor chip of the first plurality of semiconductor chips, a second portion of the semiconductor chip of the second plurality of semiconductor chips overlapping with the first step, the second plurality of semiconductor chips having first through electrodes connected to the first connectors;
a third plurality of semiconductor chips disposed in the third level of such that a first portion of a semiconductor chip of the third plurality of semiconductor chips overlaps with a portion of a semiconductor chip of the second plurality of semiconductor chips and a second portion of the semiconductor chip of the third plurality of semiconductor chips overlaps with the second step, the third plurality of semiconductor chips having second through electrodes connected to the first through electrodes; and
a second dielectric layer filling the multistep cavity to cover the first, second, and third pluralities of semiconductor chips.

* * * * *